US012610802B2

(12) United States Patent
  Zang

(10) Patent No.: US 12,610,802 B2
(45) Date of Patent: Apr. 21, 2026

(54) METHOD FOR FORMING CONTACT STRUCTURE, SEMICONDUCTOR STRUCTURE AND MEMORY

(71) Applicant: CHANGXIN MEMORY TECHNOLOGIES, INC., Hefei City (CN)

(72) Inventor: Junsheng Zang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 598 days.

(21) Appl. No.: 18/163,856

(22) Filed: Feb. 2, 2023

(65) Prior Publication Data

US 2023/0187269 A1     Jun. 15, 2023

Related U.S. Application Data

(63) Continuation of application No. PCT/CN2022/092125, filed on May 11, 2022.

(30) Foreign Application Priority Data

Nov. 15, 2021    (CN) .......................... 202111349889.0

(51) Int. Cl.
  *H01L 21/768* (2006.01)
  *H01L 23/522* (2006.01)

(52) U.S. Cl.
  CPC .... *H01L 21/76804* (2013.01); *H01L 23/5226* (2013.01)

(58) Field of Classification Search
  CPC ....... H01L 25/167; H01L 23/60; H01L 24/05; H01L 24/32; H01L 24/83; H01L 25/165;

H01L 2224/05572; H01L 2224/05573; H01L 2224/32145; H01L 2224/83201; H01L 2224/83851; H01L 25/075; H01L 25/0753; H10H 20/855; H10H 20/857; G09F 9/302; G09F 9/33; G09F 9/3023; H10D 86/00; H10D 86/40; H10D 86/60
See application file for complete search history.

(56) References Cited

U.S. PATENT DOCUMENTS

| | | | |
|---|---|---|---|
| 8,890,318 B2 | 11/2014 | Lin | |
| 9,054,160 B2 | 6/2015 | Bruce | |
| 9,245,791 B2 | 1/2016 | Lin | |
| 9,343,354 B2 | 5/2016 | Lin | |
| 10,861,711 B1 | 12/2020 | Chiu | |
| 2012/0261828 A1* | 10/2012 | Bruce | .............. H01L 21/76825 257/774 |

(Continued)

FOREIGN PATENT DOCUMENTS

| | | |
|---|---|---|
| CN | 112701056 A | 4/2021 |
| CN | 113517223 A | 10/2021 |

*Primary Examiner* — Karen Kusumakar
(74) *Attorney, Agent, or Firm* — SYNCODA LLC; Feng Ma

(57) ABSTRACT

A method for forming a contact structure includes: a base is provided and a sacrificial layer is formed on the base; the sacrificial layer is patterned to form a first gap exposing the base in the sacrificial layer; a dielectric layer is deposited in the first gap; the sacrificial layer is removed to form a second gap between dielectric layers; at least part of the dielectric layer at a periphery of the second gap is etched, to enlarge a size of an opening of the second gap.

8 Claims, 4 Drawing Sheets

(56) References Cited

U.S. PATENT DOCUMENTS

| | | |
|---|---|---|
| 2012/0261829 A1 | 10/2012 | Lin |
| 2013/0330923 A1 | 12/2013 | Lin et al. |
| 2015/0270219 A1 | 9/2015 | Bruce et al. |
| 2015/0318208 A1 | 11/2015 | Lin et al. |
| 2021/0320107 A1* | 10/2021 | Ping .................. H10B 12/0335 |

* cited by examiner

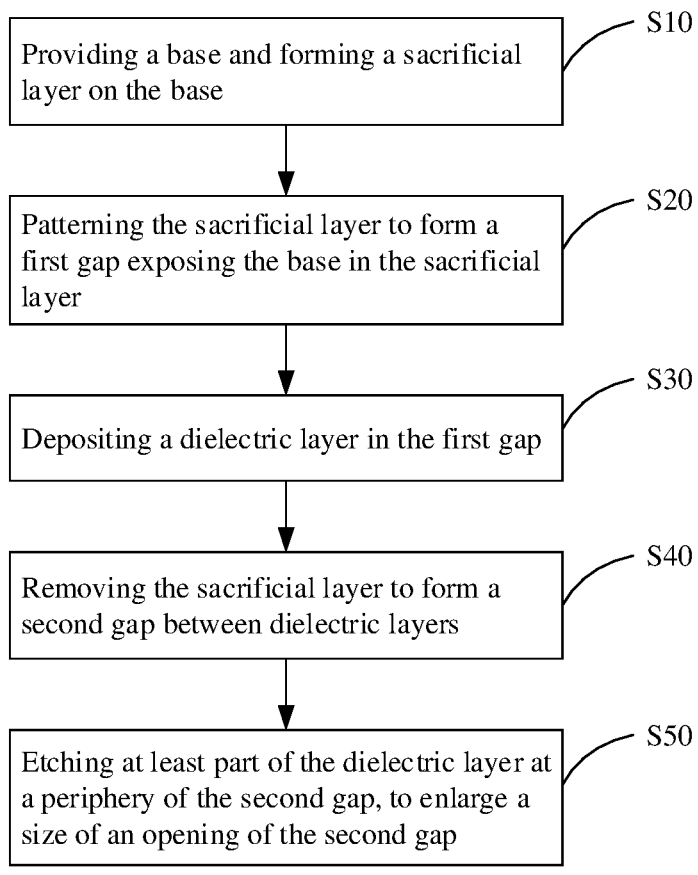

| | |
|---|---|
| Providing a base and forming a sacrificial layer on the base | S10 |
| Patterning the sacrificial layer to form a first gap exposing the base in the sacrificial layer | S20 |
| Depositing a dielectric layer in the first gap | S30 |
| Removing the sacrificial layer to form a second gap between dielectric layers | S40 |
| Etching at least part of the dielectric layer at a periphery of the second gap, to enlarge a size of an opening of the second gap | S50 |

FIG. 1

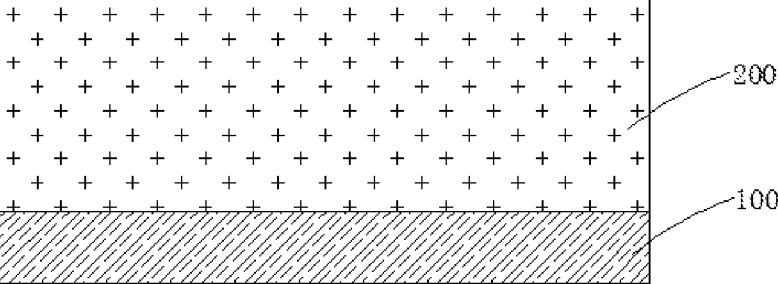

FIG. 2

METHOD FOR FORMING CONTACT STRUCTURE, SEMICONDUCTOR STRUCTURE AND MEMORY

CROSS-REFERENCE TO RELATED APPLICATIONS

This is a continuation of International Application No. PCT/CN2022/092125 filed on May 11, 2022, which claims priority to Chinese Patent Application No. 202111349889.0 filed on Nov. 15, 2021. The disclosures of the above-referenced applications are hereby incorporated by reference in their entirety.

BACKGROUND

A Dynamic Random Access Memory (DRAM) is a kind of semiconductor memory. With the development of DRAM manufacturing technology, Metal-Oxide-Semiconductor Field-Effect Transistor (MOSFET) devices are shrinking in size, and the Aspect-Ratio (AR) of a contact structure is getting larger. Under-etching is prone to occur when etching under high aspect ratio (HAR), which leads to disconnection.

SUMMARY

The present disclosure relates to, but is not limited to, a method for forming a contact structure, a semiconductor structure, and a memory.

The embodiments of the disclosure provide a method for forming a contact structure, a semiconductor structure and a memory.

According to some embodiments, a first aspect of the embodiments of the present disclosure provides a method for forming a contact structure, which includes the following operations. A base is provided and a sacrificial layer is formed on the base. The sacrificial layer is patterned to form a first gap exposing the base in the sacrificial layer. A dielectric layer is deposited in the first gap. The sacrificial layer is removed to form a second gap between dielectric layers. At least part of the dielectric layer is etched at a periphery of the second gap, to enlarge a size of an opening of the second gap.

According to some embodiments, a second aspect of the embodiments of the present disclosure provides a semiconductor structure, which includes: a base; a dielectric layer on the base, a second gap is in the dielectric layer, the second gap has different sizes in a direction parallel to the substrate; and a contact structure, the second gap is filled with the contact structure.

According to some embodiments, a third aspect of the embodiments of the present disclosure provides a semiconductor memory including the contact structure described in any of the preceding embodiments.

BRIEF DESCRIPTION OF THE DRAWINGS

FIG. 1 is a schematic diagram of a flowchart of a method for forming a contact structure according to an embodiment of the present disclosure;

FIG. 2 shows a first illustration of a process of forming a contact structure according to embodiments of the present disclosure;

LIST OF REFERENCE NUMERALS

Figure 3:
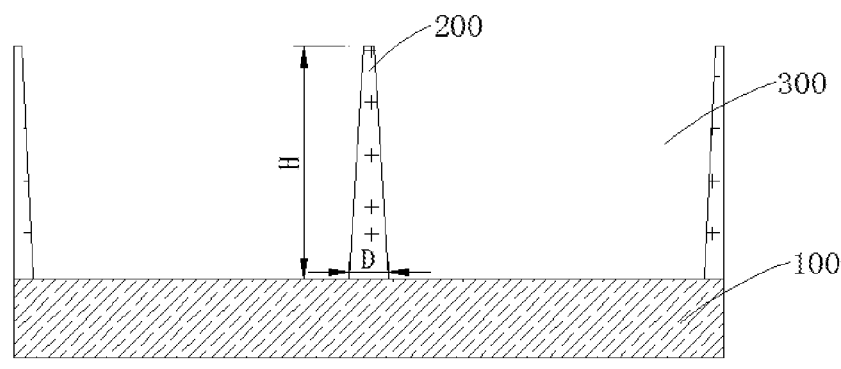
FIG. 3 shows a second illustration of a process of forming a contact structure according to embodiments of the present disclosure.

100: base;
200: sacrificial layer;
300: first gap;
400: dielectric layer;
410: first dielectric layer;
420: second dielectric layer;
500: second gap;
600: contact structure;
D: Maximum size;
H: first height;
h1: first thickness;
h2: second thickness;
d1: first maximum size;
d2: second maximum size.

DETAILED DESCRIPTION

In order to make the objectives, technical solutions and advantages of the embodiments of the present disclosure clearer, the embodiments of the present disclosure will be described in further detail below in combination with specific implementations with reference to the accompanying drawings. It should be understood that these descriptions are exemplary only and are not intended to limit the scope of the disclosed embodiments. Furthermore, in the following description, a description of well-known structures and techniques is omitted to avoid unnecessarily confusing the concepts of the present disclosure.

As shown in FIG. 1, a method for forming a contact structure is provided, which includes the following operations.

At S10, a base 100 is provided and a sacrificial layer 200 is formed on the base 100.

At S20, the sacrificial layer 200 is patterned to form a first gap 300 exposing the base 100 in the sacrificial layer.

At S30, a dielectric layer 400 is deposited in the first gap 300.

At S40, the sacrificial layer 200 is removed to form a second gap 500 between dielectric layers 400.

At S50, at least part of the dielectric layer 400 at a periphery of the second gap 500 is etched, to enlarge a size of an opening of the second gap 500.

According to the method for forming the contact structure 600 provided by the embodiment of the present disclosure, a sacrificial layer 200 is deposited on a base 100, a first gap 300 is formed in the sacrificial layer 200 and a dielectric layer 400 filling the first gap 300 is formed, then a second gap 500 for being filled with the contact structure 600 is formed after removing the sacrificial layer 200. In the method, under-etching is not prone to occur for the second gap 500, which is useful to solve the disconnection problem of the contact structure 600 caused by under-etching under HAR.

In some embodiments, the base 100 is a conductive base 100.

Exemplarily, the base 100 may be a conductive layer on a substrate. Herein, the substrate may be a semiconductor substrate, a silicon-on-insulator (SOI) substrate, a germanium-on-insulator (GOI) substrate, a single crystal metal oxide substrate, and the like. A surface area of the substrate may be formed with a plurality of deep grooves. An isolation material is filled in deep grooves to form isolation areas. A plurality of active areas are isolated by the isolation areas on the substrate. A plurality of active areas distributed in an array or other forms may be isolated by the isolation areas on the substrate. The active areas can be formed by implanting impurities into the substrate. For example, the active areas can be formed by an ion implantation process. The conductive layer may be a wire layer electrically connected to the active areas of the substrate or may be a wire layer interconnected with other wires. It is to be noted that those skilled in the art will understand that there are other structures for normal operation of the memory in the substrate, besides the isolation areas and the active areas.

As shown in FIG. 2, in operation S10, a sacrificial layer 200 is formed on a base 100.

In some embodiments, the sacrificial layer 200 may be polycrystalline silicon, monocrystalline silicon or silicide, and the sacrificial layer 200 may be formed by a Spin-On Deposition (SOD) process, a chemical vapor deposition (CVD) process, a plasma enhanced chemical vapor deposition (PECVD) process, a high density plasma chemical vapor deposition (HDP-CVD) process, or the like. For example, the sacrificial layer 200 is polycrystalline silicon formed by SOD. The sacrificial layer 200 formed by SOD has better adhesion and gap filling ability.

As shown in FIG. 3, in operation S20, a first gap 300 exposing the base 100 is formed in the sacrificial layer 200.

In some embodiments, a plurality of the first gaps 300 are formed on the base 100, the sacrificial layer 200 is between adjacent first gaps 300, the sacrificial layer 200 between the first gaps 300 has a maximum size D in a direction parallel to the base 100, and the maximum size D is smaller than or equal to one tenth of a size of an opening of the first gap 300.

In some embodiments, the size of the opening of the first gap 300 may gradually decrease in a direction perpendicular to the base 100, so that the sacrificial layer 200 between the first gaps 300 is trapezoidal, thereby the sacrificial layer 200 is not prone to collapse during the formation of the first gap 300. Exemplarily, a spacing exists between adjacent sacrificial layers 200 in the direction parallel to the base 100, the spacing gradually decreases in the direction perpendicular to the base.

In other exemplary embodiments, the size of the opening of the first gap 300 may also constant in the direction perpendicular to the base 100.

In some embodiments, the formation process of the first gap 300 may be wet etching or dry etching, such as, wet etching with phosphoric acid (H3PO4) as an etching solution or dry etching with N2 plasma as an etching gas.

In some embodiments, in order to form the contact structure 600 with a HAR structure, the sacrificial layer 200 between respective the first gaps 300 has a first height H in a direction perpendicular to the base 100, the first height H is not smaller than ten times the maximum size D of the sacrificial layer 200.

Figure 4:
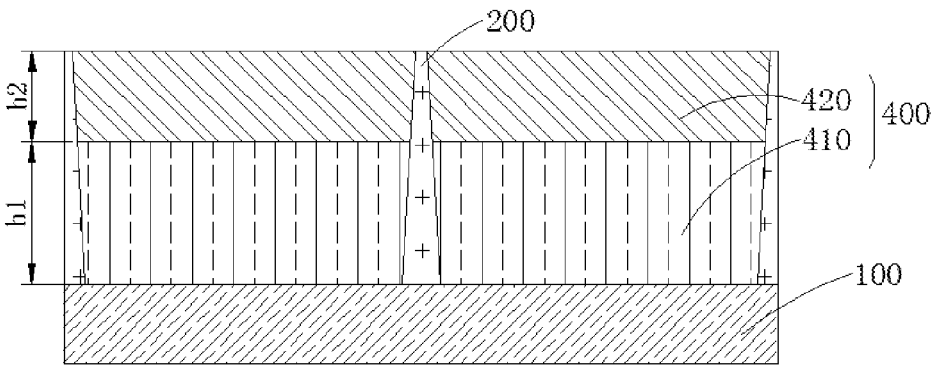
FIG. 4 shows a third illustration of a process of forming a contact structure according to embodiments of the present disclosure.

As shown in FIG. 4, in operation S30, a dielectric layer 400 is deposited in the first gap 300.

In some embodiments, the dielectric layer 400 may include silicon oxide, silicon nitride, silicon oxynitride, and the like. For example, the dielectric layer 400 may be formed by using undoped silicate glass (USG), spin on glass (SOG), phosphosilicate glass (PSG), borosilicate glass (BSG), boron-phosphosilicate glass (BPSG), flowable oxide (FOX), tetraethyllorthosilicate (TEOS), plasma enhanced TEOS (PE-TEOS), Tonen silazane (TOSZ), high density plasma chemical vapor deposition (HDP-CVD) oxide, and the like, which may be used alone or in combination. In addition, the dielectric layer 400 may be formed by a SOD process, a CVD process, a PECVD process, a HDP-CVD process, and the like.

In some embodiments, the dielectric layer 400 includes a first dielectric layer 410 and a second dielectric layer 420 on the first dielectric layer 410. The first dielectric layer 410 has a first thickness h1 in the direction perpendicular to the base 100. The second dielectric layer 420 has a second thickness h2 in the direction perpendicular to the base 100. The first thickness h1 is greater than the second thickness h2.

Exemplarily, the dielectric layer 400 may be formed by: depositing a first dielectric film within the first gap 300, removing a part of the first dielectric film so that its surface reaches a preset height to form the first dielectric layer 410, depositing a second dielectric film within the first gap 300 and on the first dielectric layer 410, removing a part of the second dielectric film so that its surface is flush with the surface of the sacrificial layer 200 to form the second dielectric layer 420.

Figure 5:
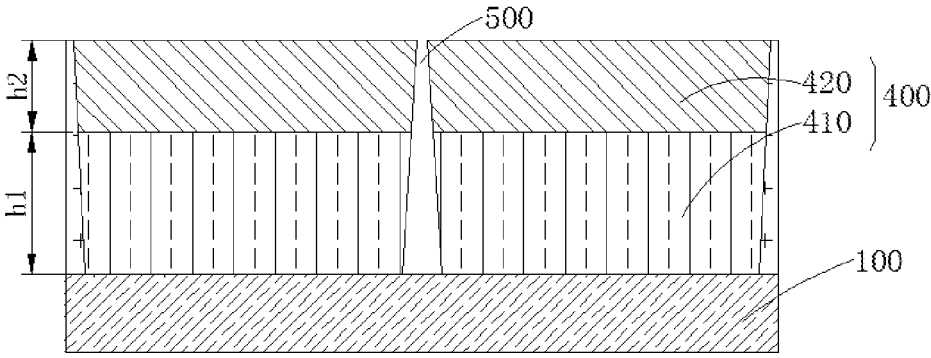
FIG. 5 shows a fourth illustration of a process of forming a contact structure according to embodiments of the present disclosure.

As shown in FIG. 5, in operation S40, the sacrificial layer 200 is removed to form a second gap 500 between dielectric layers 400.

In some embodiments, the sacrificial layer 200 may be removed by using a wet cleaning process, for example, wet etching with phosphoric acid (H3PO4) as an etching solution.

In this embodiment, in the method adopting the wet cleaning process, a suitable etching material can be selected, so that the wet cleaning has a certain etching selection ratio for the sacrificial layer 200 and the dielectric layer 400, thereby avoiding the etching of the dielectric layer 400 which may damage the structure in the process of etching the sacrificial layer 200. In other embodiments, the material of the sacrificial layer 200 is a carbonaceous material, and in the subsequent process of removing the sacrificial layer 200 to form the second gap 500, the sacrificial layer 200 may be removed by an ashing process. The ashing gas reacts with the carbonaceous material to generate a carbon dioxide gas, thereby converting the sacrificial layer 200 into gaseous carbon dioxide to remove the sacrificial layer 200. Therefore, a collapse phenomenon due to a large impact on the dielectric layer 400 in the sidewall is prevented during the formation of the second gap 500.

Figure 6:
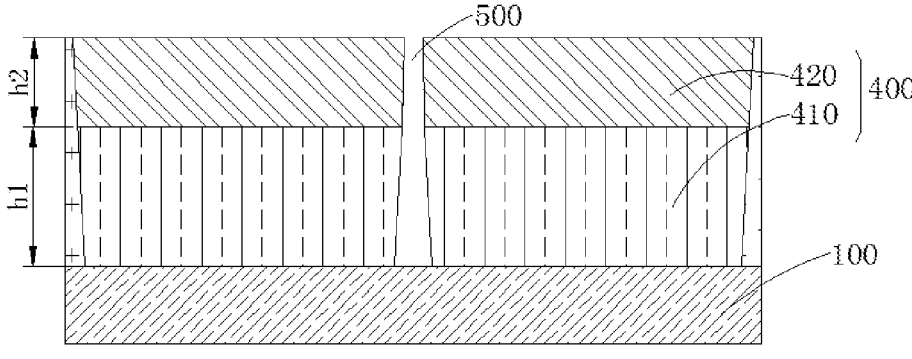
FIG. 6 shows a fifth illustration of a process of forming a contact structure according to embodiments of the present disclosure.

As shown in FIG. 6, in operation S50, at least part of the dielectric layer 400 at a periphery of the second gap 500 is etched to enlarge a size of an opening of the second gap 500.

In some embodiments, the size of the opening of the second gap 500 may be enlarged by etching the second dielectric layer 420. After the size of the opening of the second gap 500 is enlarged, the formed contact structure 600 may has a smaller contact resistance. In consideration of the demand of the final size of the second gap 500, the second dielectric layer 420 does not need to be too thick, because the top opening size may be too large if the second dielectric layer 420 is too thick, but the size of the remaining gap is not effectively enlarged.

In some embodiments, at least part of the second dielectric layer 420 at the periphery of the second gap 500 may be etched by using a wet cleaning process, such as, wet etching with phosphoric acid (H3PO4) as an etching solution.

Figure 7:
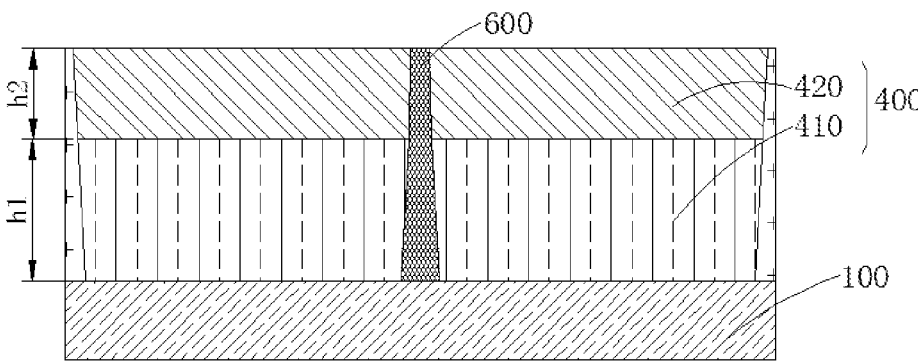
FIG. 7 shows a sixth illustration of a process of forming a contact structure according to embodiments of the present disclosure.

As shown in FIG. 7, in some embodiments, the method for forming the contact structure 600 further includes the following operations.

A conductive material is filled into the second gap 500 after the etching process, to form a contact structure 600.

Exemplarily, the material of the contact structure 600 may include tungsten, silicon nitride, silicon oxynitride and the like. For example, a stop layer may be formed by using undoped silicate glass (USG), spin on glass (SOG), phosphosilicate glass (PSG), borosilicate glass (BSG), boron-phosphosilicate glass (BPSG), flowable oxide (FOX), tetraethyllorthosilicate (TEOS), plasma enhanced TEOS (PE-TEOS), Tonen silazane (TOSZ), high density plasma chemical vapor deposition (HDP-CVD) oxide, and the like, which can be used alone or in combination.

Figure 8:
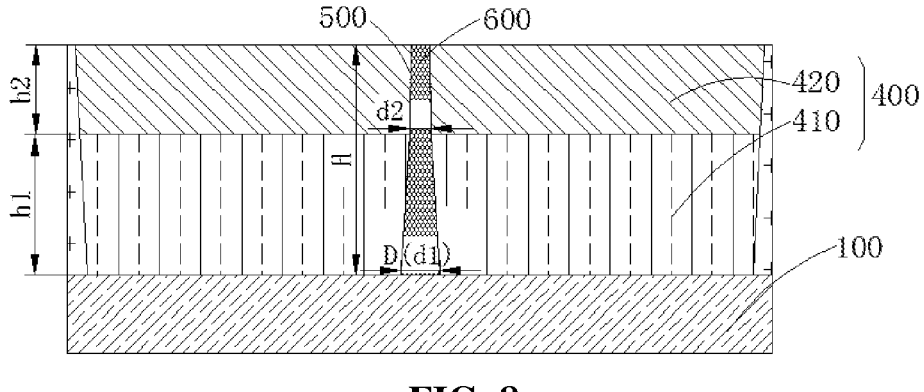
FIG. 8 is a schematic structural diagram of a contact structure according to an embodiment of the present disclosure.

As shown in FIG. 8, an embodiment of the present disclosure also provides a contact structure. The contact structure includes: a base 100; a dielectric layer 400 on the base 100, a second gap 500 is in the dielectric layer 400, the second gap 500 has different sizes in a direction parallel to the substrate 100; and a contact structure 600, the second gap 500 is filled with the contact structure 600.

For the contact structure 600 according to the embodiment of the present disclosure, a sacrificial layer 200 may be deposited on a base 100, a first gap 300 is formed in the sacrificial layer 200 and a dielectric layer 400 filling the first gap 300 is formed, then a second gap 500 for being filled with the contact structure 600 is formed after removing the sacrificial layer 200. In the method, under-etching is not prone to occur for the second gap 500, which is useful to solve the disconnection problem of the contact structure 600 caused by under-etching under HAR.

In some embodiments, the base 100 includes metal wire layer.

Exemplarily, the base 100 includes a conductive layer on a substrate. Herein, the substrate may be a semiconductor substrate, a silicon-on-insulator (SOI) substrate, a germanium-on-insulator (GOI) substrate, a single crystal metal oxide substrate, and the like. A surface area of the substrate may be formed with a plurality of deep grooves. An isolation material is filled in deep grooves to form isolation areas. A plurality of active areas are isolated by the isolation areas on the substrate. A plurality of active areas distributed in an array or other forms may be isolated by the isolation areas on the substrate. The active areas can be formed by implanting impurities into the substrate. For example, the active areas can be formed by an ion implantation process. It is to be noted that those skilled in the art will understand that there are other structures for normal operation of the memory in the substrate, besides the isolation areas and the active areas.

In some embodiments, in order to form a contact structure 600 with a HAR structure, the contact structure 600 has a first height H in a direction perpendicular to the base 100, and the contact structure 600 has a maximum size D in the direction parallel to the base 100. The first height H is not smaller than ten times the maximum size D.

In some embodiments, in the direction parallel to the base 100, the contact structure 600 has a first maximum size d1 in the second gap 500 in the first dielectric layer 410. In this embodiment, the first maximum size d1 is equal to the maximum size D of the contact structure 600. In the direction parallel to the base 100, the contact structure 600 has a second maximum size d2 in the second gap 500 in the second dielectric layer 420, the second maximum size d2 is not smaller than the first maximum size d1.

Exemplarily, the first maximum size d1 may be a size of one end of the contact structure 600 which is contiguous to the base 100, and the second maximum size d2 may be a size of the end of the contact structure 600 away from the base 100 in the first dielectric layer 410. Such a contact structure 600 has a larger contact area and thus a smaller contact resistance.

In order to form the contact structure 600 having the first maximum size d1 and the second maximum size d2 at both ends respectively, at first, a matched second gap 500 may be formed. For example, in order to form a matched second gap 500, a trapezoidal gap may be formed in the dielectric layer firstly, and then a size of the opening of the trapezoidal gap may be etched and enlarged to form the required second gap 500.

In some embodiments, the dielectric layer 400 may be layered in order to facilitate enlargement of the opening of the trapezoidal gap. However, if the to-be-etched portion of the dielectric layer 400 is thick, the top opening size of the second gap 500 may be too large, but the size of the remaining gap cannot be effectively enlarged, therefore, the thickness of the to-be-etched portion of the dielectric layer 400 may be reduced.

Exemplarily, the dielectric layer 400 includes a first dielectric layer 410 and a second dielectric layer 420 on the first dielectric layer 410. The first dielectric layer 410 has a first thickness h1 in the direction perpendicular to the base 100. The second dielectric layer 420 has a second thickness h2 in the direction perpendicular to the base 100. The first thickness h1 is greater than the second thickness h2.

In some embodiments, the dielectric layer 400 may include silicon oxide, silicon nitride, silicon oxynitride, and the like. For example, the dielectric layer 400 may be formed by using undoped silicate glass (USG), spin on glass (SOG), phosphosilicate glass (PSG), borosilicate glass (BSG), boron-phosphosilicate glass (BPSG), flowable oxide (FOX), tetraethyllorthosilicate (TEOS), plasma enhanced TEOS (PE-TEOS), Tonen silazane (TOSZ), high density plasma chemical vapor deposition (HDP-CVD) oxide, and the like, which may be used alone or in combination. In addition, the dielectric layer 400 may be formed by a SOD process, a CVD process, a PECVD process, a HDP-CVD process, and the like.

In some embodiments, the material of the contact structure 600 may include tungsten, silicon nitride, silicon oxynitride and the like.

Figure 9:
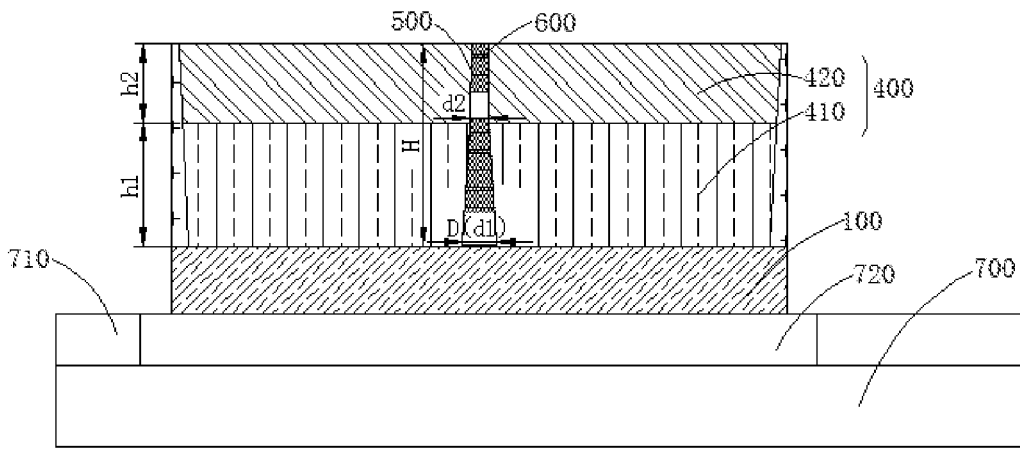
FIG. 9 is a schematic structural diagram of a semiconductor structure according to an embodiment of the present disclosure.

As shown in FIG. 9, an embodiment of the present disclosure also provides a semiconductor structure. The semiconductor structure includes: a substrate 700, an isolation area 710 and an active area 720 are formed on the substrate 700; a base 100, the base 100 is formed on the substrate 700 and adjacent to the active area 720; a dielectric layer 400 on the base 100, a second gap 500 is in the dielectric layer 400, the second gap 500 has different sizes in a direction parallel to the substrate 100; and a contact structure 600, the second gap 500 is filled with the contact structure 600.

For, the contact structure 600 according to the embodiment of the present disclosure, a sacrificial layer 200 may be deposited on a base 100, a first gap 300 is formed in the sacrificial layer 200 and a dielectric layer 400 filling the first gap 300 is formed, then a second gap 500 for being filled with the contact structure 600 is formed after removing the sacrificial layer 200. In the method, under-etching is not prone to occur for the second gap 500, which is useful to solve the disconnection problem of the contact structure 600 caused by under-etching under HAR.

In some embodiments, the substrate may be a semiconductor substrate, a silicon-on-insulator (SOI) substrate, a germanium-on-insulator (GOI) substrate, a single crystal metal oxide substrate, and the like. A surface area of the substrate may be formed with a plurality of deep grooves. An isolation material is filled in deep grooves to form isolation areas. A plurality of active areas are isolated by the isolation areas on the substrate. A plurality of active areas distributed in an array or other forms may be isolated by the isolation areas on the substrate. The active areas can be formed by implanting impurities into the substrate. For example, the active areas can be formed by an ion implantation process. It is to be noted that those skilled in the art will understand that there are other structures for normal operation of the memory in the substrate, besides the isolation areas and the active areas.

In some embodiments, the base 100 includes a metal wire layer.

In some embodiments, in order to form a contact structure 600 with a HAR structure, the contact structure 600 has a first height H in a direction perpendicular to the base 100, and the contact structure 600 has a maximum size D in the direction parallel to the base 100 The first height H is not smaller than ten times the maximum size D.

In some embodiments, in the direction parallel to the base 100, the contact structure 600 has a first maximum size d1 in the second gap 500 in the first dielectric layer 410. In this embodiment, the first maximum size d1 is equal to the maximum size D of the contact structure 600. In the direction parallel to the base 100, the contact structure 600 has a second maximum size d2 in the second gap 500 in the second dielectric layer 420. The second maximum size d2 is not smaller than the first maximum size d1.

Exemplarily, the first maximum size d1 may be a size of one end of the contact structure 600 which is contiguous to the base 100, and the second maximum size d2 may be a size of the end of the contact structure 600 away from the base 100 in the first dielectric layer 410. Such a contact structure 600 has a larger contact area and thus a smaller contact resistance.

In order to form the contact structure 600 having the first maximum size d1 and the second maximum size d2 at both ends respectively, at first, a matched second gap 500 may be formed. For example, in order to form a matched second gap 500, a trapezoidal gap may be formed in the dielectric layer firstly, and then a size of the opening of the trapezoidal gap may be etched and enlarged to form the required second gap 500.

In some embodiments, the dielectric layer 400 may be layered in order to facilitate enlargement of the opening of the trapezoidal gap. However, if the to-be-etched portion of the dielectric layer 400 is thick, the top opening size of the second gap 500 may be too large, but the size of the remaining gap cannot be effectively enlarged. Therefore, the thickness of the to-be-etched portion of the dielectric layer 400 may be reduced.

Exemplarily, the dielectric layer 400 includes a first dielectric layer 410 and a second dielectric layer 420 on the first dielectric layer 410. The first dielectric layer 410 has a first thickness h1 in the direction perpendicular to the base

100. The second dielectric layer 420 has a second thickness h2 in the direction perpendicular to the base 100. The first thickness h1 is greater than the second thickness h2.

In some embodiments, the dielectric layer 400 may include silicon oxide, silicon nitride, silicon oxynitride, and the like. For example, the dielectric layer 400 may be formed by using undoped silicate glass (USG), spin on glass (SOG), phosphosilicate glass (PSG), borosilicate glass (BSG), boron-phosphosilicate glass (BPSG), flowable oxide (FOX), tetraethyllorthosilicate (TEOS), plasma enhanced TEOS (PE-TEOS), Tonen silazane (TOSZ), high density plasma chemical vapor deposition (HDP-CVD) oxide, and the like, which may be used alone or in combination. In addition, the dielectric layer 400 may be formed by a SOD process, a CVD process, a PECVD process, a HDP-CVD process, and the like.

In some embodiments, the material of the contact structure 600 may include tungsten, silicon nitride, silicon oxynitride and the like. For example, a stop layer may be formed by using undoped silicate glass (USG), spin on glass (SOG), phosphosilicate glass (PSG), borosilicate glass (BSG), boron-phosphosilicate glass (BPSG), flowable oxide (FOX), tetraethyllorthosilicate (TEOS), plasma enhanced TEOS (PE-TEOS), Tonen silazane (TOSZ), high density plasma chemical vapor deposition (HDP-CVD) oxide, and the like, which may be used alone or in combination.

An embodiment of the present disclosure also provides a memory, which includes the contact structure or the semiconductor structure described in the preceding embodiments.

Herein, the memory may include a Random Access Memory (RAM) or a Read-Only Memory (Read-Only Memory). Optionally, the memory includes a non-transitory computer-readable storage medium. The memory may be used to store instructions, programs, codes, code sets or instruction sets.

The above-described technical solutions of the embodiments of the disclosure have at least the following beneficial technical effects:

With a method for forming a contact structure according to the embodiments of the present disclosure, a sacrificial layer is deposited on a base, a first gap is formed in the sacrificial layer and a dielectric layer filling the first gap is formed, forming a second gap for being filled with the contact structure is formed after removing the sacrificial layer. In the method, under-etching is not prone to occur for the second gap, which is useful to solve the disconnection problem of the contact structure caused by under-etching under HAR. In addition, before filling the contact structure, the method also etches at least part of the dielectric layer on at the periphery of the second gap, so that the size of the opening of the second gap can be enlarged, which is useful to reduce the contact resistance of the contact structure.

It should be understood that the above-described specific implementations according to the embodiments of the present disclosure are merely used to illustrate or explain the principles of the present disclosure, rather than limiting the present disclosure. Therefore, any modifications, equivalents, improvements, etc. made without departing from the spirit and scope of the present disclosure shall be incorporated into the protection scope of the present disclosure. Furthermore, the appended claims of the present disclosure are intended to cover all variations and modifications falling within the scope and boundaries of the appended claims or equivalent forms of such scope and boundaries.

What is claimed is:

1. A method for forming a contact structure, comprising:

providing a base and forming a sacrificial layer on the base;

patterning the sacrificial layer to form a first gap exposing the base in the sacrificial layer;

depositing a dielectric layer in the first gap;

removing the sacrificial layer to form a second gap between dielectric layers; and etching at least part of the dielectric layer at a periphery of the second gap, to enlarge a size of an opening of the second gap.

2. The method of claim 1, wherein the base is a conductive base.

3. The method of claim 1, wherein a plurality of first gaps are formed on the base, the sacrificial layer is between adjacent first gaps, and in a direction parallel to the base, the sacrificial layer between the first gaps has a maximum size, and the maximum size is smaller than or equal to one tenth of a size of an opening of the first gap.

4. The method of claim 3, wherein the sacrificial layer has a first height in a direction perpendicular to the base, the first height is not smaller than ten times the maximum size of the sacrificial layer.

5. The method of claim 3, wherein the dielectric layer comprises a first dielectric layer and a second dielectric layer on the first dielectric layer, the first dielectric layer has a first thickness in the direction perpendicular to the base, the second dielectric layer has a second thickness in the direction perpendicular to the base, and the first thickness is greater than the second thickness.

6. The method of claim 3, wherein a spacing exists between adjacent sacrificial layers in the direction parallel to the base, the spacing gradually decreases in the direction perpendicular to the base.

7. The method of claim 1, further comprising:

filling a conductive material into the second gap after the etching process to form a contact structure.

8. The method of claim 1, wherein at least one of the sacrificial layer or the at least part of the deposited dielectric layer at the periphery of the second gap is removed using a wet cleaning process.

* * * * *